April 11, 1967 C. E. DRUMHELLER 3,313,988

FIELD EFFECT SEMICONDUCTOR DEVICE AND METHOD OF FORMING SAME

Filed Aug. 31, 1964

INVENTOR.
CARL E. DRUMHELLER

BY [signature]
ATTORNEY

United States Patent Office 3,313,988

Patented Apr. 11, 1967

3,313,988

FIELD EFFECT SEMICONDUCTOR DEVICE AND METHOD OF FORMING SAME

Carl E. Drumheller, Pittsford, N.Y., assignor to General Dynamics Corporation, a corporation of Delaware Filed Aug. 31, 1964, Ser. No. 393,248
9 Claims. (Cl. 317—234)

The present invention relates to semiconductor devices, and particularly to field effect semconductor devices, such as field effect transistors.

Although the invention is applicable in various semiconductor devices, the invention is especially useful in thin film transistors.

In known thin film transistors a pair of metal electrodes, known as source and drain electrodes, are arranged on a layer of semiconductor material and spaced from each other to define a channel therebetween. A metal gate electrode, usually separated from the semiconductor layer by a thin insulating film is arranged in the region of the channel. Such known transistors are described in detail in an article appearing in Electronics magazine, Apr. 20, 1964, pp. 53 to 60 and references that article appearing on page 60 thereof. The frequency response of a thin film transistor depends, among other things, upon the inter-electrode spacing between the source and drain electrodes, i.e., the width of the channel. The gain-bandwidth product of a thin film transistor circuit also varies inversely with the source-drain interelectrode spacing. Accordingly, microscopic interelectrode spacings of the order of five microns have been used in known thin film transistors. Delicate evaporation techniques involving the use of masks which require precise positioning have been used to construct thin film transistors. Because of the delicacy of these manufacturing techniques, thin film transistors are still in the laboratory stage, in spite of their potential usefulness in integrated circuits and their high frequency response.

Accordingly, it is an object of the present invention to provide an improved semiconductor device.

It is a further object of the invention to provide an improved field effect semiconductor device, such as a field effect transistor.

It is a still further object of the invention to provide an improved thin film transistor.

It is a still further object of the present invention to provide an improved thin film transistor having high frequency response characteristics, which transistor is relatively independent of source-drain interelectrode spacing as compared to known thin film transistors.

It is a still further object of the invention to provide an improved thin film transistor which is more adaptable to mass production than known thin film transistors.

It is a still further object of the present invention to provide improved methods for manufacturing semiconductor devices which methods are especially adapted for the manufacture of ultra-miniature microelectronic circuits including such devices.

Briefly described, a semiconductor device embodying the invention includes a body of semiconductor material having a film of polycrystalline material disposed thereon. Source and drain electrodes are also associated with the semiconductor body and are spaced from each other to define a channel therebetween which is bridged by the polycrystalline film. The gaps between the boundaries of the crystallites or grains comprising the film provide the effective interelectrode spacing between the source and drain electrodes. Since these gaps may be very narrow (e.g., of the order of 30 A. to 100 A.) (angstrom units) the transistor has a high frequency response. A control or gate electrode separated by a thin insulating layer from the polycrystalline film and semiconductor body is also associated therewith in the channel region thereof.

The invention itself, both as to its organization and method of operation, as well as additional objects and advantages thereof will become more readily apparent from a reading of the following description in connection with the accompanying drawings in which.

Figure 1:
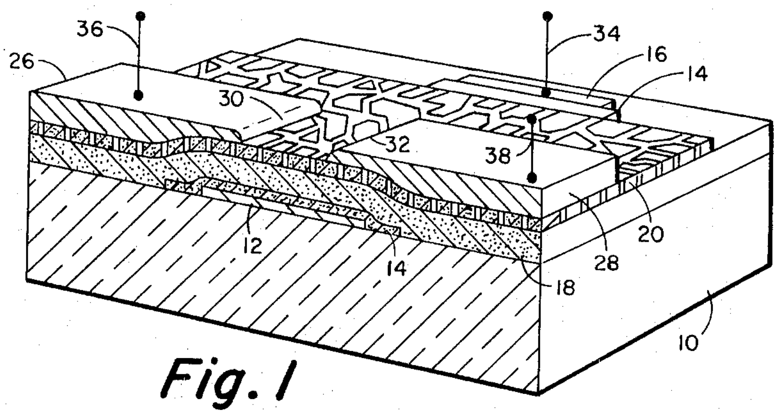
FIG. 1 is an enlarged diagrammatic view, partially in section and partially in perspective, showing a semiconductor device in accordance with an embodiment of the invention.

Referring more particularly to FIG. 1, there is shown, greatly enlarged, a semi-conductor device of the thin film transistor type. The device includes a wafer 10 which provides an insulating substrate on which thin films may be deposited to provide the device. The substrate may be glass. However, ceramic insulating materials may be used. A metal electrode 12 is deposited upon the substrate 10. This electrode may be a suitable conducting material such as tellurium, indium, gold, or aluminum. However, gold is preferred. A thin insulating film 14 overlies the electrode 12, except for a terminal portion 16 thereof. The thin film may be of silicone monoxide or calcium fluoride which is evaporated over the electrode 12. A layer 18 of semiconductor material is deposited over the insulated electrode 12 and the surface of the substrate 10. This layer 18 may be a thin film of cadmium sulfide, cadmium selenide, or cadmium telluride. Cadmium sulfide is presently preferred. The semiconductor layer 18, the insulating layer 14 and the electrode 12 may be deposited by thin film techniques known in the art, such as by evaporation in an evacuated chamber.

A thin film 20 of polycrystalline material is disposed over the semiconductor material layer 18, and may be deposited thereon by evaporation, sputtering, electro-deposition, or chemical deposition techniques. Film 20 is shown in greater detail in FIGS. 2 and 3. A polycrystalline film is a film in which crystallization takes place in a polygonal geometry such that the crystallites (crystal grains) which are formed have plane boundaries. These plane boundaries, or crystallite edges are spaced from each other. The intergrain boundary spacings define gaps in the crystal structure. These gaps in a suitably deposited polycrystalline film may be from 30 A. to 100 A. in width. The polycrystalline film may be formed from a metal or semi-metal material. Bismuth is a suitable semi-metal, and copper is a suitable metal.

Figures 2, 3, 4:
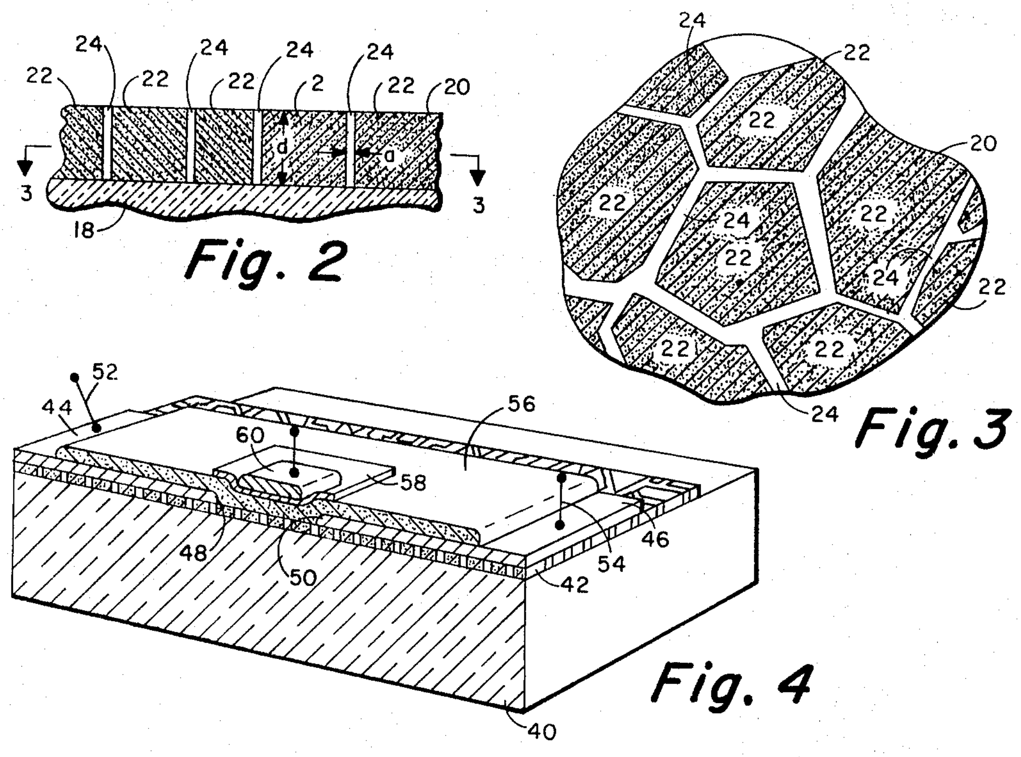
FIG. 2 is a fragmentary sectional view, greatly enlarged, of a portion of the device shown in FIG. 1.
FIG. 3 is a fragmentary sectional view of the portion of the device shown in FIG. 1, the section being taken along the line 3—3 when viewed in the direction of the appended arrows.
FIG. 4 is an enlarged diagrammatic view, partially in section and partially in perspective, illustrating a semiconductor device in accordance with another embodiment of the invention.

As will be observed from FIG. 2, the film includes a plurality of individual crystallites or crystal grains 22, the boundaries of which define gaps 24. These gaps are substantially perpendicular to the semi-conductor material layer 18. The crystal grains 22 are themselves conductive, the gaps however are non-conductive. At the present time it is believed, although it is not definitely ascertained, that the gaps 18 may be wholly or partially filled with oxide material. This material is bismuth oxide if the polycrystalline layer is bismuth, or copper oxide, if the polycrystalline layer is copper.

The following is an example of a method whereby the polycrystalline layer may be formed. The partially completed device, including the substrate 10, gate electrode 12, insultating film 14, and semiconductor layer 18, is placed in a chamber, such as a bell jar or other thin film evaporating apparatus, and the chamber evacuated to a pressure of $10^{-6}$ to $10^{-4}$ torr. (mm. of mercury). An electrical heating element, such as a molybdenum rod having a recess in which an amount of bismuth is placed, is used. This molybdenum rod is disposed in the chamber below the exposed surface of the semiconductor coated substrate. Electrical current is passed through the rod causing the bismuth to melt and evaporate. The evaporated bismuth condenses on the exposed surface of the semiconductor layer 18. Evaporation is allowed to proceed until a thin film of approximately 3,000 A. is formed. The vacuum in the chamber is controlled to maintain the pressure range indicated above so as to provide an oxidizing atmosphere in the chamber. This oxidizing atmosphere is believed to be responsible for the formation of the polycrystalline film with very narrow intergrain spacings or gaps 24 (FIG. 2). Intergrain spacings, indicated by the dimension (a) in FIG. 2 may be from 30 A. to 100 A. when the foregoing method is followed.

The following additional step may be used to control the thickness of the polycrystalline film (indicated by the dimension (d) in FIG. 2) as well as the intergrain spacing of the film. Two electrodes may be disposed at the opposite edges of a square area on the wafer. An electrical bridge circuit is connected to these electrodes and used to monitor the resistances of the film. When the resistance of the film, formed during the evaporation process, is between 10 ohms per square and 10,000 ohms per square, the evaporation process may be interrupted. The resulting thin film will have the requisite thickness and gap dimensions.

Metal electrodes 26 and 28, known in the thin film transistor art as source and drain electrodes, are deposited over the polycrystalline film 20. The opposing ends 30 and 32 of these electrodes 26 and 28, respectively, are spaced from each other and define a channel directly over the gate electrode 12. The same material may be used to provide the source and drain electrodes 26 and 28 as is used to provide the gate electrode 12. Terminals 34, 36 and 38 may be ohmically connected, as by soldering, respectively, to the gate, source, and drain electrodes 16, 26 and 28.

The operation of the device is presently not completely understood. The following mode of operation is mentioned without implying any adherence or limitation thereto. Charge carriers are injected into the channel defined between the opposing ends 30 and 32 of the electrodes. These charge carriers enter the channel through the conductive crystallites or grains of the polycrystalline film. Since the gaps 24 of the film in the channel region are non-conductive, the charge carriers must enter the semiconductor since they can not pass through these gaps. Tunnelling currents, i.e., charge carriers which tunnel widthwise across the gaps, are insignificant at the potentials applied to the electrodes 26 and 28, which potentials may be of the order of 10 volts. The space charges are injected into the channel region at random. However, the channel region is effectively only as wide as the cumulative, random gaps between the crystals. Since these gaps are of the order of tens of angstrom units in width, the effective width of the channel region may be less than one micron, even though the opposite ends of the electrodes are spaced apart by tens of microns. The tolerances for the spacings of the electrodes 26 and 28 are also not critical, due to the random nature of the gap. Statistically, despite some variation in the interelectrode spacing, the effective chanel width remains the same. Accordingly, the device is reproducible in large quantities without appreciable variations from device to device. Respecting the operation of the device, it is believed that the device operates in a manner similar to the thin film transistors which are described in the above referenced articles. However, the frequency response and the gain-bandwidth product of a circuit including the device, may be appreciably higher.

Referring to FIG. 4, there is shown another thin film transistor embodying the invention. This is a transistor which includes a substrate 40 of insulating material, such as glass or ceramic. A polycrystalline thin film 42 is a material similar to the material of the polycrystalline film 20 (FIG. 1) and is deposited on the surface of the substrate 40, for example, the same methods of deposition as described above, i.e., evaporation in a controlled, oxidizing atmosphere. A pair of electrodes 44 and 46 which may serve as source and drain electrodes are deposited on the polycrystalline film 42. The opposing ends 48 and 50 of these electrodes are spaced from each other and may bridge a large number of the crystallites or grains of the film 42. These electrodes 44 and 46 may be of material similar to the electrodes 26 and 28. However, a metal such as gold is preferred. Leads 52 and 54 are connected, as by soldering, to the exposed portions of the electrodes 44 and 46.

A layer 56 of semiconductor material is deposited, in the form of a thin film, over the electrodes 44 and 46 and over the polycrystalline film in the interelectrode gap between the electrode ends 48 and 50. This semiconductor layer or film 56 may be deposited by evaporation and may have a thickness similar to semiconductor films used in known thin film transistors which are described in the above referenced publications. The material of the film 56 may be selected from the same group of materials as described above in the case of the semiconductor layer 18 (FIG. 1). Cadmium sulfide, at the present time, is preferred. A channel is formed in the thin film 56 between the opposing ends 48 and 50 of the electrodes 44 and 46. An insulating film 58 is deposited, as by evaporation, over a portion of the channel region on the semiconductor film 56. This layer 58 separates the semiconductor from another electrode 60 which may serve as the gate electrode in the transistor device. This gate electrode may be a metal or other material as was described in the case of electrode 12 (FIG. 1), gold being preferred. Silicon monoxide or calcium fluoride may be used for the insulating film 58.

The thin film transistor shown in FIG. 4 has a coplanar electrode structure, and has a planar polycrystalline film 42, which is deposited directly upon the substrate 40. In other respects, the transistor shown in FIG. 4 is similar to the transistor shown in FIG. 1. A principal advantage of both transistors is that the random array of gaps in the portion of the polycrystalline film which bridges the channel region of the transistor, permits the electrodes 44 and 46 to be spaced further apart than in known thin film transistors. Also the location of these electrodes and their dimensions is not as critical in known thin film transistors. Accordingly, the device of FIG. 4, as well as the device of FIG. 1, are readily adapted to large-scale production techniques.

Figure 5:
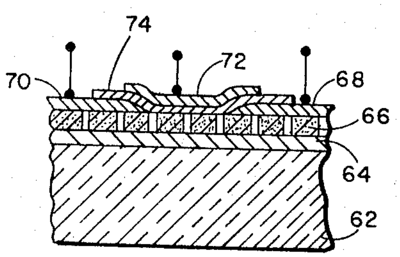
FIG. 5 is a fragmentary, enlarged, sectional view, diagrammatically showing, a semiconductor device in accordance with still another embodiment of the invention.

FIG. 5 illustrates another embodiment of thin film transistor, including a substrate wafer 62, a layer of semiconductor material 64 deposited directly upon the substrate wafer 62, and a polycrystalline thin film 66 deposited directly upon the semiconductor layer 64. The substrate 62, semiconductor layer 64 and polycrystalline film 66 are all in parallel planes. A co-planar structure including three electrodes 68 and 70, which may serve as source and drain electrodes, and a gate electrode 72, are deposited on the polycrystalline film layer. The gate electrode 72 is separated from the polycrystalline film 66 and from the source and drain electrodes 68 and 70 by a thin insulating film 74. The materials of the various layers, films, and electrodes, may be the same as those materials used for similarly described parts in the device in FIGS. 1 and 4. The electrodes 68 and 70 define a channel region in the semiconductor layer 64 which is bridged by the polycrystalline film 66. The gate electrode 72 is disposed over this channel region. In other respects, the device of FIG. 5 operates in a manner similar to thin film transistors. The device of FIG. 5 has further advantages in that its co-planar electrode structure parallel plane film structure and lends itself to ease of manufacture.

From the foregoing description, it will be apparent that there has been provided an improved semiconductor device. Advantages of the device arise from the use of a polycrystalline film having a random array of crystallites or crystal grains, which grains are separated by gaps which are also randomly disposed and which are exceedingly narrow. Although such a film is especially useful in thin film transistor devices, it may also become useful in other semiconductor devices. While a plurality of embodiments of the invention have been described, variations in these embodiments as well as additional embodiments, within the scope of the invention, will undoubtedly become apparent to those skilled in the art. Accordingly, the foregoing description should be taken merely as illustrative and not in any limiting sense.

What is claimed is:

1. A thin film transistor comprising a thin film of semiconductor material, a thin film of polycrystalline material overlying at least a portion of a surface of said semiconductor film, said polycrystalline material film having grain boundaries substantially perpendicular to said semiconductor film surface, the grain boundaries of adjacent grains in said film being spaced from each other to define gaps therebetween, source and drain electrodes in contact with said polycrystalline film, said electrodes being spaced from each other to define a channel region therebetween, said polycrystalline film contacting said semiconductor film in said channel region and gate electrode means disposed adjacent said channel region.

2. The invention as set forth in claim 1 wherein said polycrystalline film is a material selected from the class of metals, consisting of copper and bismuth.

3. The invention as set forth in claim 1 wherein said polycrystalline film gaps are of the order of 30 A. to 100 A. in width.

4. The invention as set forth in claim 3 wherein said film is of the order of from 300 A. to a few thousand A. in thickness.

5. The invention as set forth in claim 1 wherein said polycrystalline film has a resistance from about 10 ohms per square to about 10,000 ohms per square.

6. A thin film transistor comprising a semiconductor layer having surfaces on its opposite sides, a thin film of polycrystalline material on one of said surfaces, said film having adjacent grain boundaries defining gaps substantially perpendicular to said one surface, source and drain electrodes on said polycrystalline film and overlying said one surface, said source and drain electrodes respectively having opposing ends spaced from each other to define a channel region therebetween, said semiconductor layer contacting said polycrystalline film in said channel region, said channel region being bridged by said film, a thin insulating film on the other of said opposite side semiconductor layer surfaces and overlying said channel region, and a gate electrode separated from said other surface by said insulating film.

7. A thin film transistor comprising a layer of semiconductor material, source and drain electrodes each engaging the top flat surface of said layer, said electrodes having opposing ends spaced from each other to define a channel in said semiconductor material layer between said electrodes, a thin film of polycrystalline material contacting said layer in said channel and bridging said electrodes, an insulating film engaging said semiconductor layer, and a gate electrode engaging said insulating film disposed adjacent said channel region.

8. A thin film transistor comprising a semiconductor layer having a surface, a thin film of polycrystalline material on said surface, said film having adjacent grain boundaries defining gaps substantially perpendicular to said surface, source and drain electrodes on said polycrystalline film and overlying said one surface, said source and drain electrodes respectively having opposing ends spaced from each other to define a channel region therebetween, said semiconductor layer contacting said polycrystalline film in said channel region, said channel region being bridged by said film, a thin insulating film overlying said region and a portion of said source and drain electrodes adjacent thereto, and a gate electrode separated from said channel region by said insulating film.

9. A thin film transistor comprising a body of insulating material providing a substrate, a thin film of polycrystalline material on a surface of said substrate, metal source and drain electrodes deposited on said polycrystalline film, said electrodes having opposing ends spaced from each other, a thin film of semiconductor material deposited over contacting said electrodes and over said film in the interelectrode space between said electrode ends, an insulating film deposited on said semiconductor layer over said interelectrode space, and a metal gate electrode deposited on said film.

References Cited by the Examiner

UNITED STATES PATENTS

| | | | |
|---|---|---|---|
| 2,780,569 | 2/1957 | Hewlett | 148—174 |
| 3,013,192 | 12/1961 | Starr | 148—174 |
| 3,114,867 | 12/1963 | Szekely | 317—235 |
| 3,177,100 | 4/1965 | Mayer et al. | 317—235 |
| 3,189,973 | 6/1965 | Edwards et al. | 317—235 |
| 3,191,061 | 6/1965 | Weimer | 317—235 |
| 3,202,840 | 8/1965 | Ames | 307—88.5 |

FOREIGN PATENTS

| | | |
|---|---|---|
| 1,090,771 | 11/1960 | Germany. |

JOHN W. HUCKERT, *Primary Examiner.*

J. D. CRAIG, *Assistant Examiner.*